US009893686B2

(12) United States Patent
Ripley

(10) Patent No.: US 9,893,686 B2
(45) Date of Patent: Feb. 13, 2018

(54) POWER AMPLIFIER WITH BIAS ADJUSTMENT CIRCUIT

(71) Applicant: SKYWORKS SOLUTIONS, INC., Woburn, MA (US)

(72) Inventor: David Steven Ripley, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/608,950

(22) Filed: May 30, 2017

(65) Prior Publication Data

US 2017/0331436 A1 Nov. 16, 2017

Related U.S. Application Data

(63) Continuation of application No. 14/978,640, filed on Dec. 22, 2015, now Pat. No. 9,667,200.

(60) Provisional application No. 62/096,431, filed on Dec. 23, 2014.

(51) Int. Cl.
*H03F 3/19* (2006.01)
*H03F 3/04* (2006.01)
*H03F 3/21* (2006.01)
*H03G 3/30* (2006.01)
*H04B 1/04* (2006.01)
*H04M 1/02* (2006.01)

(52) U.S. Cl.
CPC ............. *H03F 3/19* (2013.01); *H03F 3/21* (2013.01); *H03G 3/3036* (2013.01); *H04B 1/04* (2013.01); *H03F 2200/451* (2013.01); *H04M 1/0202* (2013.01)

(58) Field of Classification Search
USPC .......................................................... 330/311
IPC .......................................................... H03F 3/19
See application file for complete search history.

(56) References Cited

U.S. PATENT DOCUMENTS

| | | | |
|---|---|---|---|
| 5,850,365 A | 12/1998 | Reese et al. | |
| 7,135,929 B1 * | 11/2006 | Costa | H03F 1/22 330/296 |
| 8,432,224 B1 | 4/2013 | Woo et al. | |
| 8,847,689 B2 * | 9/2014 | Zhao | H03F 1/0283 330/277 |
| 9,166,533 B2 * | 10/2015 | Marra | H03F 1/30 |
| 2005/0090209 A1 | 4/2005 | Behzad | |
| 2006/0220731 A1 | 10/2006 | Taylor | |
| 2013/0310114 A1 | 11/2013 | Zohny et al. | |
| 2014/0043102 A1 * | 2/2014 | Su | H03F 1/223 330/295 |
| 2014/0097905 A1 * | 4/2014 | Xu | G01S 19/21 330/296 |
| 2014/0184334 A1 | 7/2014 | Nobbe et al. | |
| 2016/0126901 A1 | 5/2016 | Knopik | |

* cited by examiner

*Primary Examiner* — Patricia T Nguyen
(74) *Attorney, Agent, or Firm* — Chang & Hale LLP

(57) ABSTRACT

Power amplifier with bias adjustment circuit. In some embodiments, a power amplifier can include an amplifying transistor configured to amplify a signal, and a bias circuit coupled to a bias node of the amplifying transistor and configured to provide a bias voltage at the bias node. The power amplifier can further include a bias adjustment circuit that couples an output node of the amplifying transistor and the bias circuit. The bias adjustment circuit can be configured to adjust the bias voltage in response to a potential difference between the output node and the bias node exceeding a threshold value.

20 Claims, 10 Drawing Sheets

POWER AMPLIFIER WITH BIAS ADJUSTMENT CIRCUIT

CROSS-REFERENCE TO RELATED APPLICATION(S)

This application is a continuation of U.S. application Ser. No. 14/978,640 filed Dec. 22, 2015, entitled PEAK DETECTING CASCODE FOR BREAKDOWN PROTECTION, which claims priority to and the benefit of the filing date of U.S. Provisional Application No. 62/096,431 filed Dec. 23, 2014, entitled PEAK DETECTING CASCODE FOR BREAKDOWN PROTECTION, the benefits of the filing dates of which are hereby claimed and the disclosures of which are hereby expressly incorporated by reference herein in their respective entirety.

BACKGROUND

Field

The present disclosure relates to radio-frequency (RF) amplifiers.

Description of the Related Art

In many radio-frequency (RF) applications, amplifiers are utilized to amplify RF signals. For example, an RF signal to be transmitted can be amplified by a power amplifier (PA). In another example, an RF signal received through an antenna can be amplified by a low-noise amplifier (LNA).

SUMMARY

According to some implementations, the present disclosure relates to a power amplifier (PA) that includes an amplifying transistor configured to amplify a radio-frequency (RF) signal, and a bias circuit coupled to a bias node of the amplifying transistor and configured to yield a bias voltage at the bias node. The PA further includes a bias adjustment circuit that couples an output node of the amplifying transistor and the bias circuit. The bias adjustment circuit is configured to adjust the bias voltage in response to a potential difference between the output node and the bias node exceeding a threshold value.

In some embodiments, the amplifying transistor can be part of a cascode amplifier circuit. The amplifying transistor can be a cascode gain stage transistor. The cascode gain stage transistor can be a bipolar-junction transistor (BJT) having a base, an emitter, and a collector, such that the base is associated with the bias node and the collector is associated with the output node.

In some embodiments, the bias circuit can include an emitter follower having an emitter coupled to the base of the cascode gain stage transistor, a collector coupled to a DC voltage source, and a base coupled to a reference voltage source.

In some embodiments, the bias adjustment circuit can include a detection circuit that couples the collector of the cascode gain stage transistor and the base of the emitter follower. The detection circuit can be configured to be conducting when the potential difference is greater than the threshold value and non-conducting when the potential difference is less than or equal to the threshold value.

In some embodiments, the detection circuit can include one or more diodes arranged in series, with the number of diodes being selected based at least in part on the threshold value and turn-on characteristic of each diode. In some embodiments, the one or more diodes can include a plurality of substantially same diodes. In some embodiments, the one or more diodes can be selected to yield a potential difference threshold between the collector and base of the cascode gain stage transistor having an amount represented by $V_{diode}$ ($N_{diodes}$+2Vbe), with $V_{diode}$ being a turn-on voltage of each diode, $N_{diodes}$ being the number of diodes, and 2Vbe being the potential difference between the emitter of the emitter follower and the base of the cascode gain stage transistor.

In some embodiments, the bias adjustment circuit can further include a capacitance Cpk that couples the base of the emitter follower to ground. The capacitance Cpk can be configured to allow charge to be accumulated from the detection circuit when the detection circuit is conducting, to thereby adjust the voltage at the base of the emitter follower.

In some embodiments, the bias adjustment circuit can be configured to increase the bias voltage in response to the potential difference between the collector and the base exceeding the threshold value to thereby reduce the potential difference to a value less than the threshold value. The threshold value can be at or close to a breakdown voltage between the collector and the base of the BJT, such that the reduction of the potential difference prevents or reduces the likelihood of breakdown of the BJT. The bias adjustment circuit can be further configured to restore the bias voltage to a normal operating value when the potential difference between the collector and the base is less than or equal to the threshold value.

In some embodiments, the cascode amplifier circuit can further include a common emitter gain stage transistor having a base configured to receive the RF signal and a collector coupled to the emitter of the cascode gain stage transistor. The common emitter gain stage transistor can be configured to have a significant range of operating voltage to allow the bias voltage of the cascode gain stage transistor to be adjusted in a relatively large range to prevent or reduce the likelihood of breakdown of the cascode gain stage transistor. The relatively large range of the bias voltage available for the cascode gain stage transistor can allow the cascode gain stage transistor to be operated in a normal condition with nominal voltage peaks that are near a device breakdown voltage.

In some embodiments, the bias adjustment circuit can be a passive circuit having little or no impact on performance of the BJT when the bias voltage is at the normal operating value.

In some teachings, the present disclosure relates to a method for operating a power amplifier (PA). The method includes providing a radio-frequency (RF) signal to an amplifying transistor having a bias node and an output node. The method further includes supplying a bias voltage to the bias node to yield an amplified signal at the output node. The method further includes detecting a condition where a potential difference between the output node and the bias node exceeds a threshold value. The method further includes adjusting the bias voltage in response to the detection of the condition.

In accordance with a number of implementations, the present disclosure relates to a semiconductor die that includes a semiconductor substrate and a power amplifier (PA) implemented on the semiconductor substrate. The PA includes an amplifying transistor configured to amplify a radio-frequency (RF) signal, and a bias circuit coupled to a bias node of the amplifying transistor and configured to yield a bias voltage at the bias node. The PA further includes a bias adjustment circuit that couples an output node of the amplifying transistor and the bias circuit. The bias adjustment circuit is configured to adjust the bias voltage in response to a potential difference between the output node and the bias node exceeding a threshold value.

In some embodiments, the PA can be a gallium arsenide (GaAs) device or a silicon germanium (SiGe) device.

In a number of implementations, the present disclosure relates to a radio-frequency (RF) module that includes a packaging substrate configured to receive a plurality of components, and a power amplifier (PA) implemented on a die that is mounted on the packaging substrate. The PA includes an amplifying transistor configured to amplify an RF signal, and a bias circuit coupled to a bias node of the amplifying transistor and configured to yield a bias voltage at the bias node. The PA further includes a bias adjustment circuit that couples an output node of the amplifying transistor and the bias circuit. The bias adjustment circuit is configured to adjust the bias voltage in response to a potential difference between the output node and the bias node exceeding a threshold value.

In some teachings, the present disclosure relates to a wireless device that includes a transceiver configured to generate a radio-frequency (RF) signal, and an RF module in communication with the transceiver. The RF module includes a power amplifier (PA) having an amplifying transistor configured to amplify the RF signal. The PA further includes a bias circuit coupled to a bias node of the amplifying transistor and configured to yield a bias voltage at the bias node. The PA further includes a bias adjustment circuit that couples an output node of the amplifying transistor and the bias circuit. The bias adjustment circuit is configured to adjust the bias voltage in response to a potential difference between the output node and the bias node exceeding a threshold value. The wireless device further includes an antenna in communication with the RF module. The antenna is configured to facilitate transmission of the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Radio-frequency (RF) amplifiers such as power amplifiers (PAs) operating at conditions such as higher DC supply voltage and extreme load voltage standing wave ratio (VSWR) can be subject to voltage breakdown and reduced device reliability. Safeguards to protect against such voltage breakdown are required or desired to avoid device damage under such extreme conditions. However, such safeguards often require added design margins that result in degraded nominal operating conditions.

Figure 1:
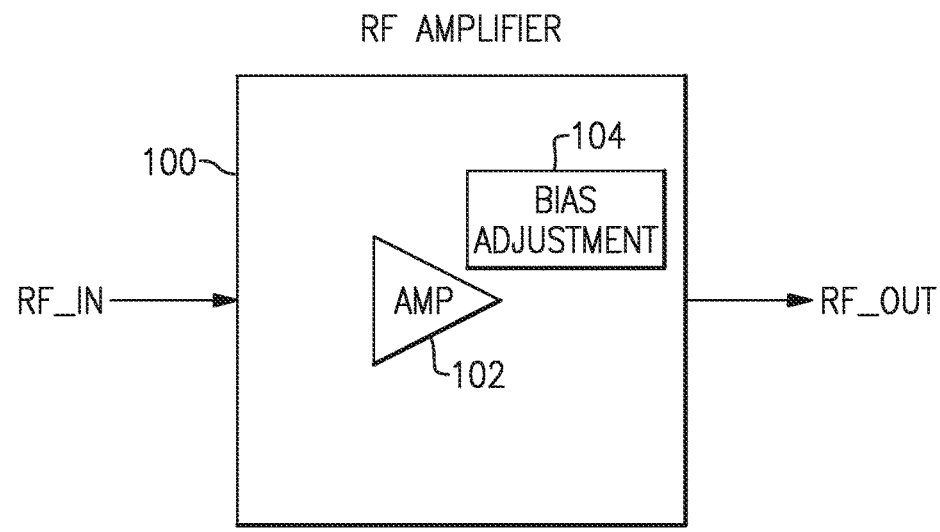
FIG. 1 depicts a radio-frequency (RF) amplifier configured to receive an input RF signal and generate an amplified RF signal.

FIG. 1 depicts an RF amplifier 100 configured to receive an input RF signal (RF_IN) and generate an amplified RF signal (RF_OUT). Such an amplification can be performed by an amplifier circuit 102 which is typically biased by a bias circuit (not shown in FIG. 1). Described herein are examples of a bias adjustment circuit 104 that can be configured to provide, for example, protection against voltage breakdown of one or more devices associated with the amplifier circuit 102. In various examples, the amplifier circuit 102 is described as having a cascode amplifier topology which can provide a number of desirable features in RF applications. However, it will be understood that one or more features of the present disclosure can also be implemented in other amplifier topologies.

Figure 2:
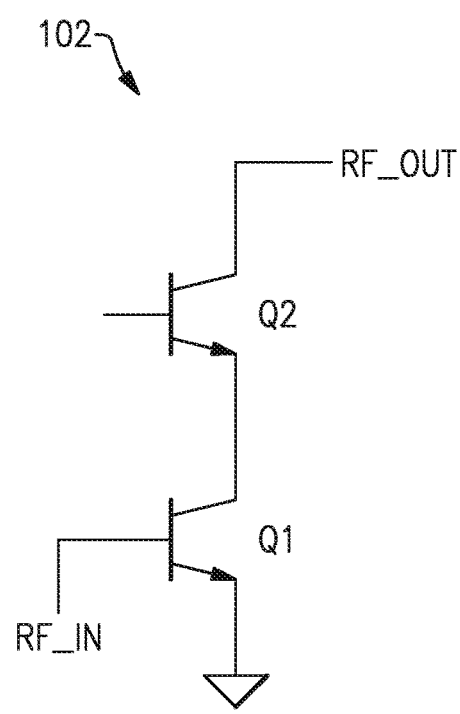
FIG. 2 depicts an example of a cascode amplifier circuit having a first transistor Q1 configured to operate as a common emitter device, and a second transistor Q2 configured to operate as a common base device.

FIG. 2 depicts an example of a cascode amplifier circuit 102 having a first transistor Q1 configured to operate as a common emitter device, and a second transistor Q2 configured to operate as a common base device. More particularly, an input RF signal (RF_IN) is shown to be provided to a base of Q1, and Q1 is shown to output an amplified signal through its collector. The emitter of Q1 is shown to be coupled to ground. The amplified signal from the collector of Q1 is shown to be provided to the emitter of Q2 for further amplification, and such further amplified signal is shown to be output as RF_OUT through the collector of Q2. Although not shown in FIG. 2, the base of Q2 is typically AC coupled to ground.

Each base of Q1 and Q2 is typically coupled to a bias circuit to provide a base bias voltage for the device (Q1 or Q2) at the base. Examples of such bias circuits are described herein in greater detail.

Figure 3:
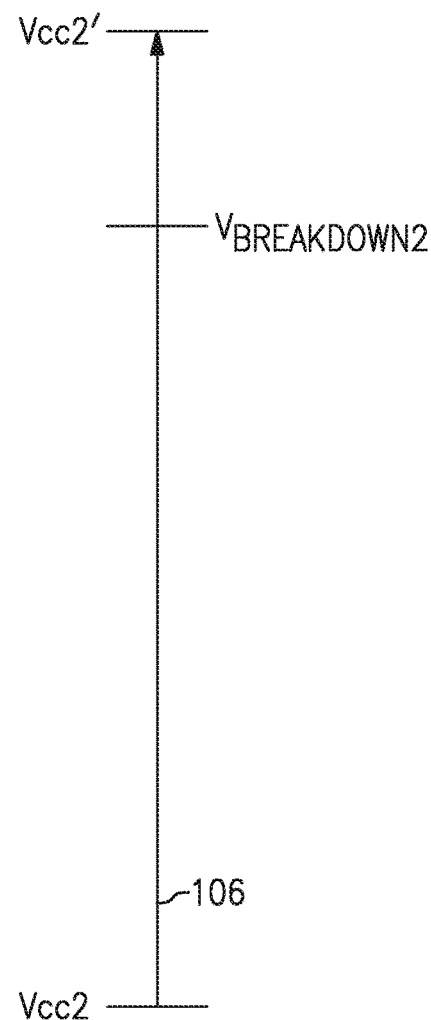
FIG. 3 depicts various voltage levels associated with operation of Q1 and Q2 of FIG. 2.

In the example of FIG. 2, each of Q1 and Q2 is an NPN device. In an example context where much of the gain of the cascode amplifier circuit 102 occurs in Q2, FIG. 3 depicts various voltage levels associated with operation of Q1 and Q2. The base of Q1 is typically provided with a relatively low voltage Vbb1. A higher base voltage Vbb2 is typically provided for the base of Q2, and the collector of Q2 has a voltage level higher than Vbb2. To accommodate the foregoing cascode configuration, there is typically a relatively large overhead in voltage associated with Q2.

As described herein, operating conditions such as higher DC supply voltage and extreme load voltage standing wave ratio (VSWR) can result in a voltage breakdown of, for example, Q2. In FIG. 3, the operating voltage level of Vcc2 is depicted as being lower than a breakdown voltage ($V_{breakdown2}$) associated with Q2. Such a breakdown voltage can be relative to, for example, the base voltage Vbb2 of Q2. Although not shown in FIG. 3, such a breakdown voltage can also be relative to the emitter voltage level of Q2. Examples of breakdowns associated with Q2 are described herein in reference to FIGS. 5 and 6.

Under the foregoing example operating condition of higher DC supply voltage and high VSWR, the collector voltage of Q2 can rise above the breakdown voltage threshold ($V_{breakdown2}$) relative to the base voltage Vbb2. In FIG. 3, such a rise of the collector voltage from the normal operating level Vcc2 to the elevated level Vcc2' is depicted by an arrow 106. Since the potential difference between Vcc2' and Vbb2 is greater than the threshold potential difference of $V_{breakdown2}$–Vbb2, breakdown can occur between the collector and the base of Q2. In some embodiments, Vbb2 can be roughly 2×Vbb1, Vcc2 can be roughly 10×Vbb1, and Vcc2' can be roughly 3×Vcc2. One or more features of the present disclosure can also be implemented in other voltage-level configurations.

Figure 4:
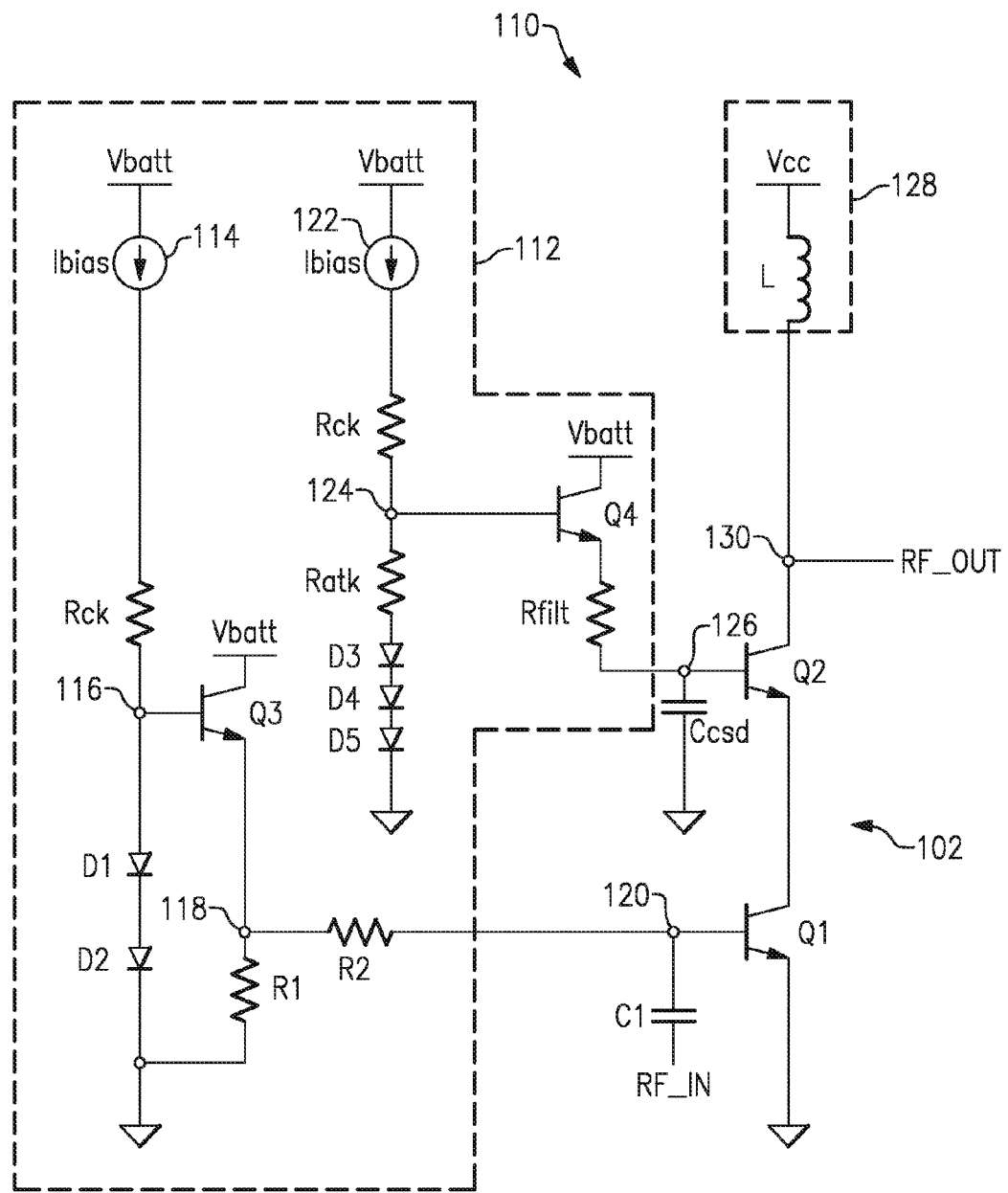
FIG. 4 shows an example of a conventional power amplifier (PA) having the cascode amplifier circuit of FIG. 2 supported by a bias circuit and a supply circuit.

FIG. 4 shows an example of a conventional power amplifier (PA) 110 having the cascode amplifier circuit 102 of FIG. 2 supported by a bias circuit 112 and a supply circuit 128. Such a conventional PA can be subjected to the breakdown described above in reference to FIG. 3, and FIGS. 5 and 6 show additional examples of such a breakdown.

In the example of FIG. 4, an input RF signal (RF_IN) is shown to be provided to the base of Q1 (at node 120) through, for example, a DC-block capacitance C1. Q2 is shown to be coupled to Q1 as described herein so as to yield an amplified RF signal as an output (RF_OUT) of the cascode amplifier circuit 102 at the collector of Q2 (at node 130).

In the example of FIG. 4, the supply circuit 128 is shown to include an inductance L that can couple a supply voltage Vcc node to the collector node 130 of Q2. The inductance L can be configured to provide, for example, RF choke functionality.

In the example of FIG. 4, the bias circuit 112 is shown to provide a bias signal to each of the base nodes (120, 126) corresponding to Q1 and Q2. For example, the base node 120 of Q1 can be coupled to a source node (e.g., a battery node Vbatt) through an emitter follower Q3 and a base resistance R2. The output of the emitter follower Q3 can be regulated by a reference voltage at the base (node 116) of Q3, and such a reference voltage can be obtained from a current source 114 configured to obtain a reference current (Ibias) sourced from Vbatt. The reference voltage at the base node 116 can be obtained from Ibias forward-biasing diodes D1 and D2, resulting in a reference voltage which tracks process and temperature of the Q1 and Q3 devices. Resistance Rck can act as a choke resistor to substantially isolate any RF signal from corrupting the Ibias reference current.

FIG. 4 further shows that a resistive shunt path (with a resistance R1) to ground can also be provided at the emitter node 118 of Q3. R1 can provide a shunt path for quiescent biasing of Q3 to properly set a low bias impedance presented to Q1 through R2. The value of R2 can be configured to control gain linearity of the cascode amplifier.

As further shown in FIG. 4, the base node 126 of Q2 is shown to be coupled to ground through a capacitance Ccsd. The base node 126 of Q2 can also be coupled to a source node (e.g., a battery node Vbatt) through an emitter follower Q4 and a base resistance Rfilt. The output of the emitter follower Q4 can be regulated by a reference voltage at the base (node 124) of Q4, and such a reference voltage can be obtained from a current source 122 configured to obtain a reference current (Ibias) sourced from Vbatt.

In the example of FIG. 4, the reference voltage at the base node 124 can be obtained from Ibias forward-biasing diodes D3-D5 plus Ratk, resulting in a reference voltage which tracks process and temperature of the Q2 and Q4 devices and providing sufficient collector-emitter voltage for Q2. Rck can act as a choke resistor to substantially isolate any RF signal from corrupting the Ibias reference current.

Figure 5:
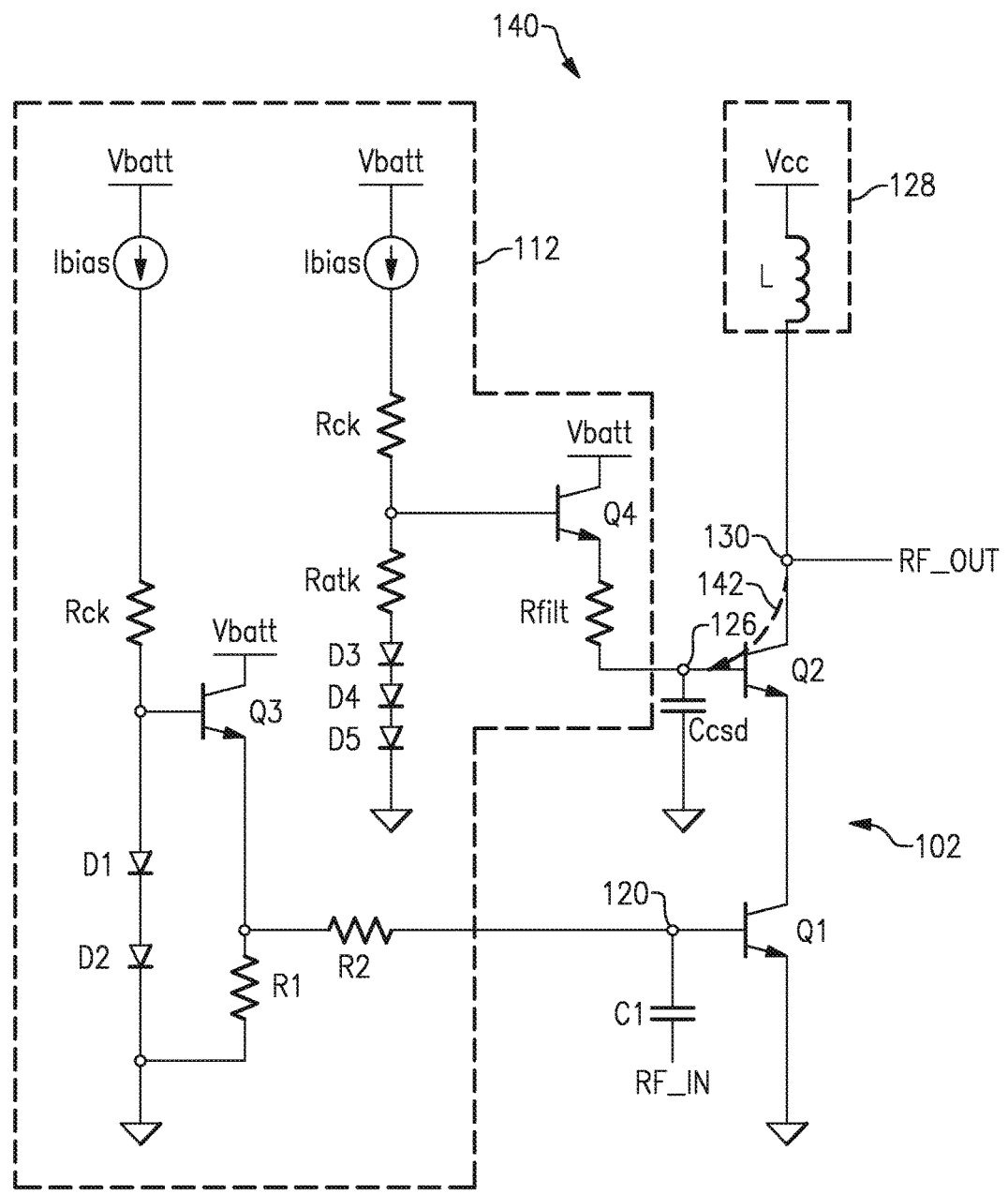
FIG. 5 shows an example of a breakdown that can occur for the example PA of FIG. 4.
Figure 6:
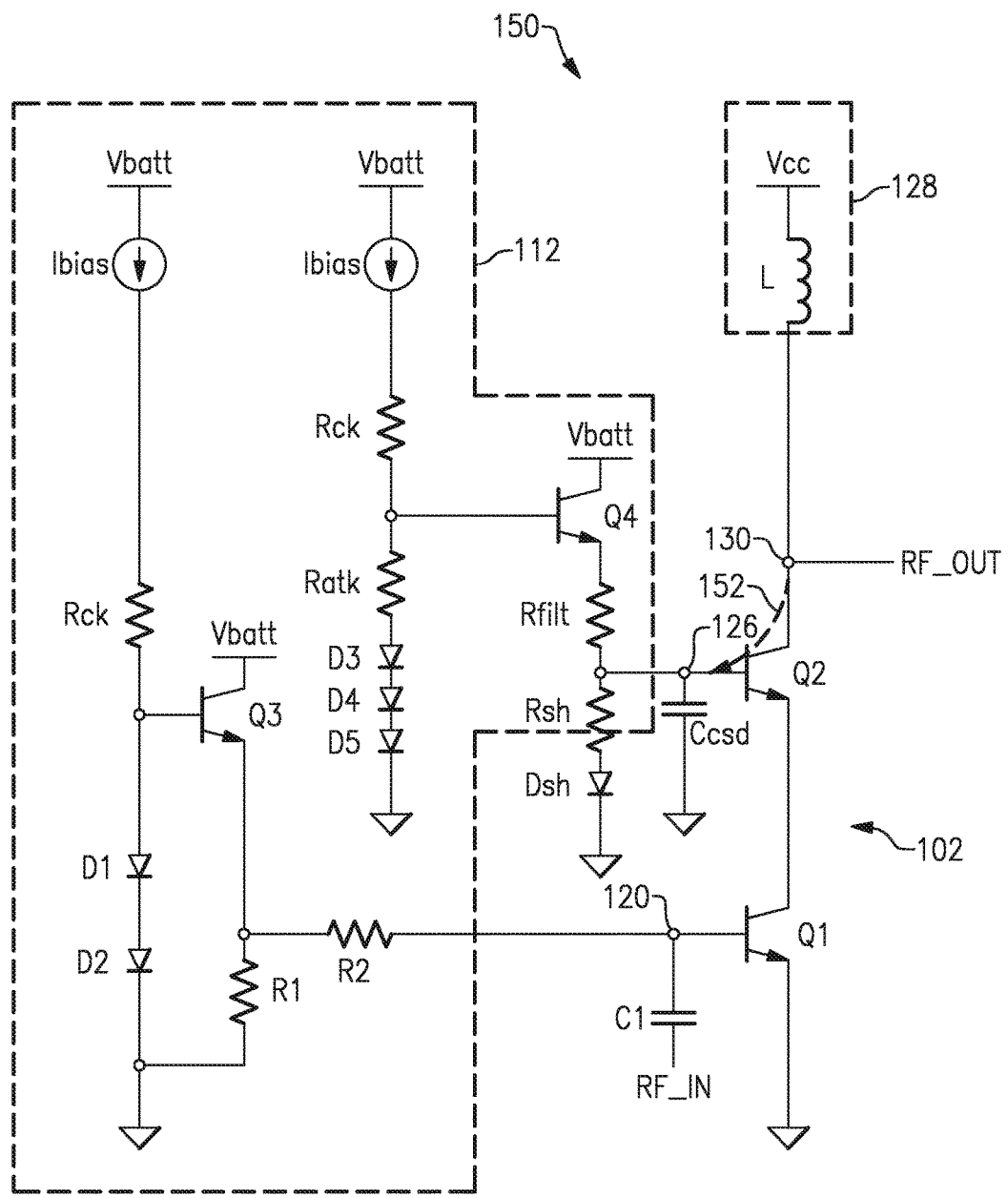
FIG. 6 shows another example of a breakdown that can occur for the example PA of FIG. 4.

FIGS. 5 and 6 show examples of breakdowns that can occur for the example PA of FIG. 4, when the voltage level at the collector node 130 of Q2 rises above a threshold level as described in reference to FIG. 3.

It is noted that a bipolar device such as the bipolar junction transistor (BJT) Q2 typically demonstrates two dominant breakdown modes. The first example breakdown mode typically involves a collector-emitter breakdown, with the base open. Such a breakdown can occur when a collector-emitter potential difference $V_{CEbo}$ exceeds a threshold which results in carrier injection at the base. A high base impedance prevents the elimination of the extra base charge, thereby forcing the carriers to flow into the base-emitter. Current gain of the device generates increased collector current driving into avalanche breakdown, and mechanical and/or thermal failure of the device can occur.

The second example breakdown mode typically involves a collector-base breakdown, with the emitter open. Such a breakdown can occur when a collector-base potential difference $V_{CBeo}$ exceeds a threshold value. When the base is presented with a low impedance path to ground, the foregoing collector-emitter breakdown involving $V_{CEbo}$ can be avoided by leaking the base charge out of the device. Such a leakage can result in further increase in collector voltage, which in turn results in the collector-base breakdown condition $V_{CBeo}$ being reached. Accordingly, a reverse-breakdown can occur for the collector-base junction diode. It is noted that $V_{CBeo}$ is often about 1.5 to 2 times that of $V_{CEbo}$.

FIG. 5 shows a breakdown configuration 140 involving the foregoing first breakdown mode in the context of the example PA 110 of FIG. 4. In the first breakdown mode involving $V_{CEbo}$, the high base impedance can prevent or reduce the removal of the extra base charge, thereby forcing the carriers to flow into the base-emitter. However, even in such a condition, the cascode device (e.g., Q2) typically will not demonstrate failure at $V_{CEbo}$ because the total emitter current is limited. Accordingly, current flow into the base as a result of $V_{CEbo}$ or $V_{CBeo}$ can lead to charging of the capacitance Ccsd and raising the base bias voltage. Thus, the increased base and emitter voltages can work to divide the high voltage stress across the two devices Q1, Q2, and lead to a breakdown of either or both devices when the collector voltage (of Q2) reaches, for example, roughly twice the value of $V_{CBeo}$. Accordingly, in the example of FIG. 5, the breakdown of Q2 is depicted as including a current flow 142 between the collector node 130 and the base node 126.

FIG. 6 shows a breakdown configuration 150 involving the foregoing second breakdown mode in the context of the example PA 110 of FIG. 4. In the second breakdown mode involving $V_{CBbo}$, presence of a relatively low impedance shunt path from the base to ground can result in the collector-base breakdown instead of the collector-emitter breakdown. Device failure in such a breakdown can occur when the current flowing through the reverse collector-to-base base breakdown and into the shunt path to ground is sufficient to cause mechanical and/or thermal damages. Accordingly, in the example of FIG. 6, the breakdown of Q2 is depicted as including a current flow 152 between the collector node 130 to the base node 126, with the current flow being facilitated by a shunt path shown to include a resistance Rsh and a diode Dsh.

Figure 7:
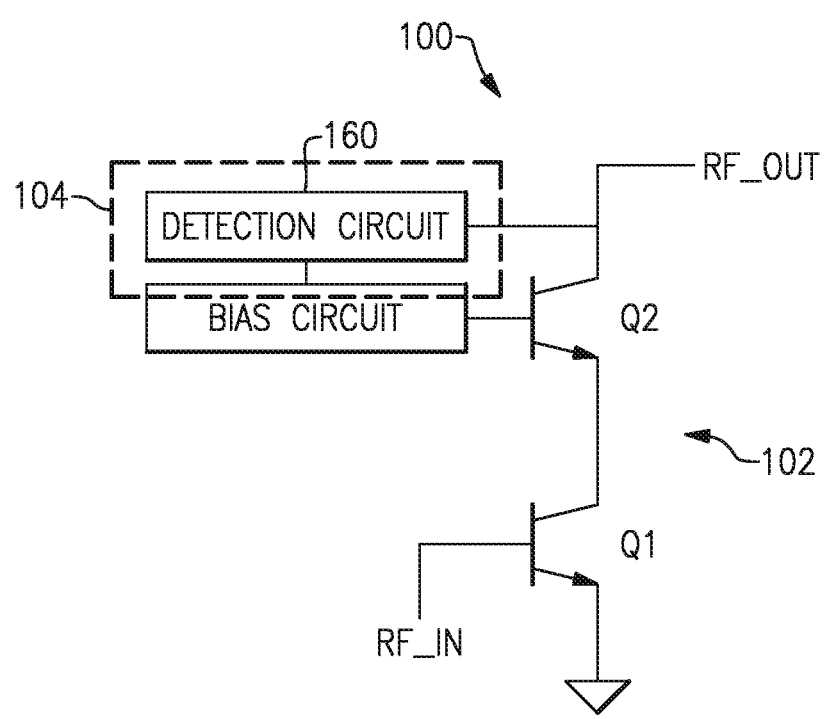
FIG. 7 shows that in some embodiments, a bias adjustment circuit can be implemented between the collector of Q2 and the bias circuit associated with Q2.

FIG. 7 shows that in some embodiments, a bias adjustment circuit 104 can be implemented between the collector of Q2 and the bias circuit associated with Q2. As described herein, such a bias adjustment circuit can be configured to inhibit or reduce the likelihood of breakdowns involving the base of Q2. For the purpose of description, the cascode amplifier circuit 102 can be similar to the example described in reference to FIG. 2.

Figure 8:
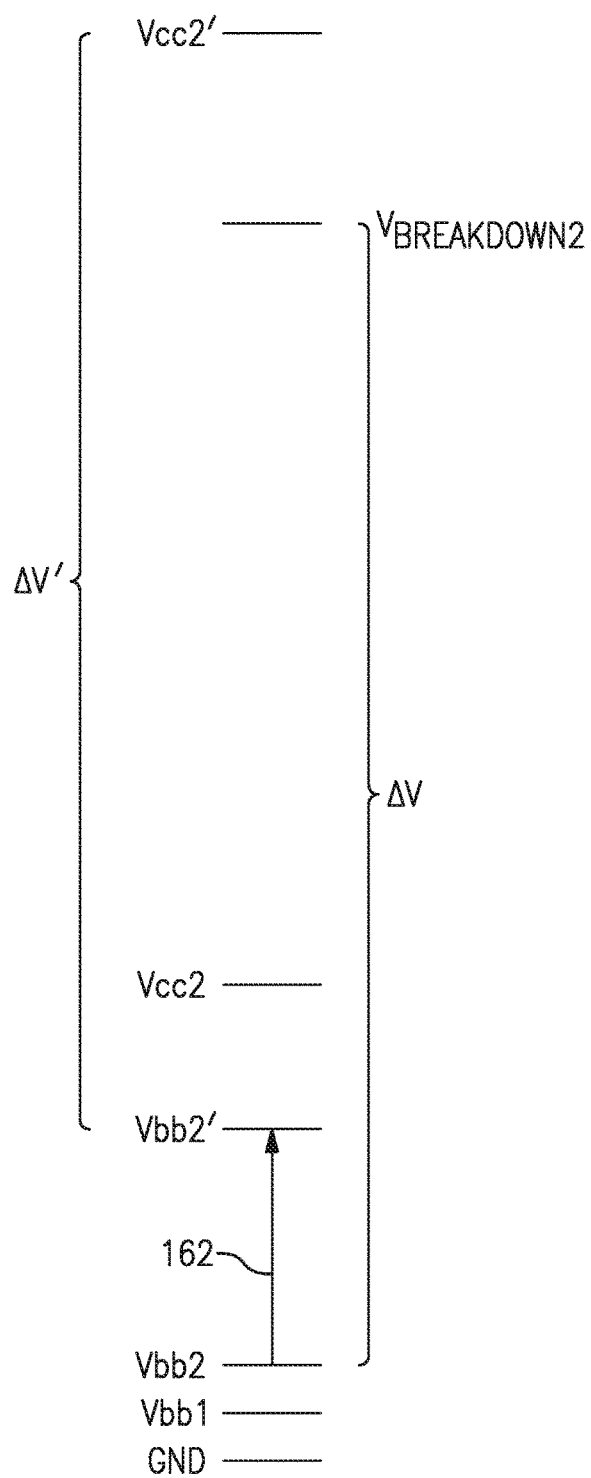
FIG. 8 depicts various voltage levels associated with operation of Q1 and Q2 of FIG. 7.

FIG. 8 depicts various voltage levels associated with operation of Q1 and Q2. Normal operating levels of Vbb1 and Vbb2 can be similar to the example described herein in reference to FIGS. 2 and 3. Similarly, the operating voltage level of Vcc2 is typically lower than a breakdown voltage (Vbreakdown2) associated with Q2. As also described herein, conditions such as higher DC supply voltage and high VSWR can lead to the collector voltage of Q2 rising above the breakdown voltage threshold ($V_{breakdown2}$) relative to the base voltage Vbb2. In FIG. 8, such an elevated level of collector voltage is indicated as Vcc2'. Since the potential difference between Vcc2' and Vbb2 is greater than the threshold potential difference ΔV of $V_{breakdown2}$-Vbb2, breakdown can occur between the collector and the base of Q2.

In some embodiments, the bias adjustment circuit 104 of FIG. 7 can be configured such that when the base voltage is maintained at Vbb2 under normal operating condition, and adjusted (e.g., raised as indicated by an arrow 162) to Vbb2' when the collector voltage exceeds the breakdown voltage threshold ($V_{breakdown2}$). In FIG. 8, such collector voltage Vcc2' and raised Vbb2' are shown to yield a potential difference ΔV'. In some embodiments, the potential difference ΔV' can be less than the potential difference ΔV between the breakdown voltage threshold ($V_{breakdown2}$) and the un-raised base voltage Vbb2. Since the potential difference ΔV' is less than the breakdown threshold potential difference of ΔV, breakdown between the collector and the base can be prevented.

FIG. 7 further shows that the bias adjustment circuit 104 can include a detection circuit 160 that couples the collector of Q2 with the bias circuit. In some embodiments, the bias adjustment circuit 104 can also include, and/or work in conjunction with, at least some portion of the bias circuit to facilitate the foregoing adjustment of the base voltage (e.g., Vbb2 to Vbb2' as shown in FIG. 8). In some embodiments, such a bias adjustment circuit can be configured to have little or no impact on performance of the PA circuit 102 under normal operating conditions.

Figure 9:
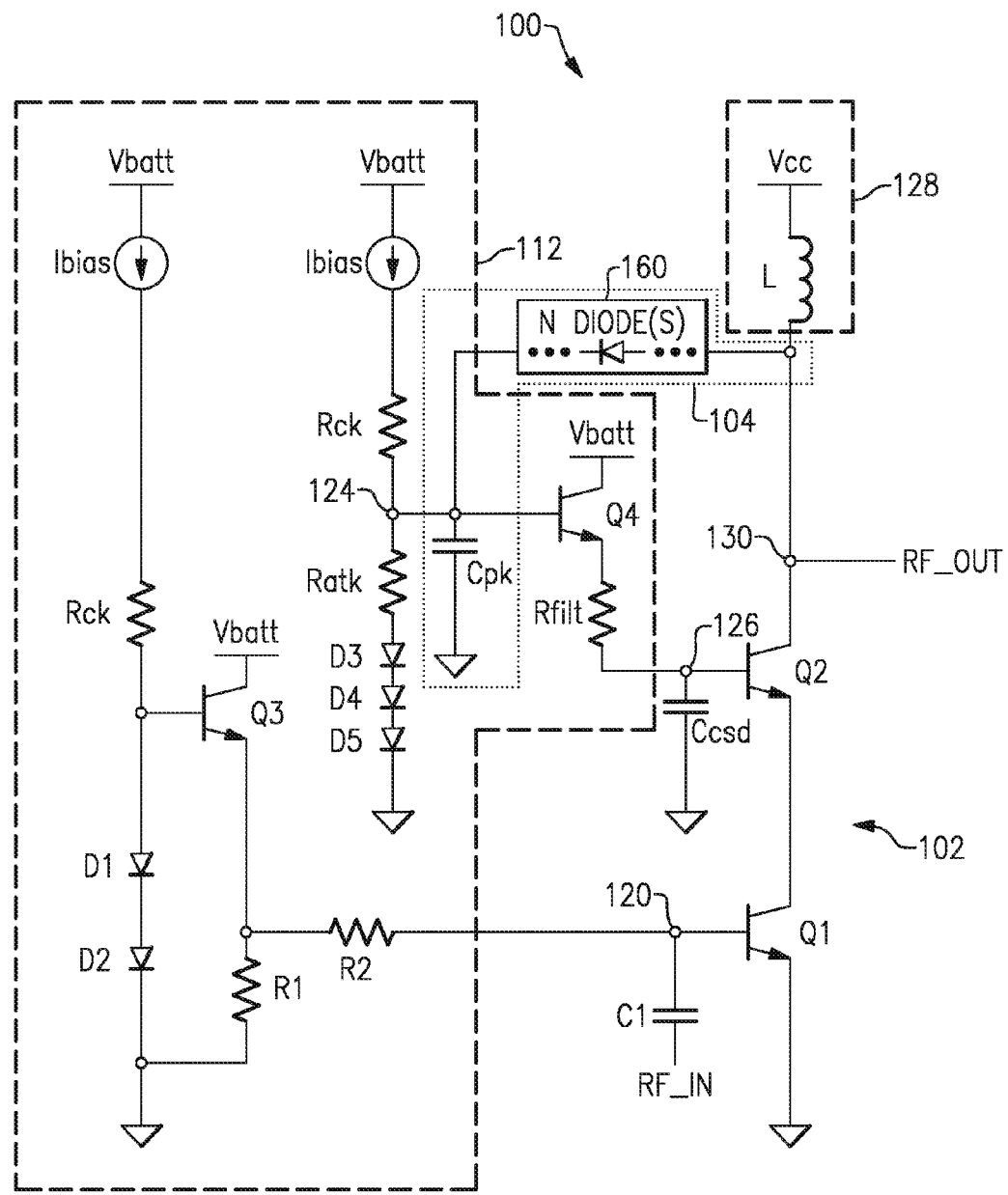
FIG. 9 shows an example of bias adjustment circuit of FIG. 7, implemented in the context of the example PA of FIG. 4.

FIG. 9 shows an example of the bias adjustment circuit 104 of FIGS. 1 and 7, implemented in the context of the example PA 110 of FIG. 4. In FIG. 9, a PA 100 is shown to include a PA circuit 102 and a supply circuit 128 that can be similar to the example of FIG. 4. A bias circuit generally indicated as 112 can be similar to the example of FIG. 4, but with an addition of a capacitance Cpk that couples the base node 124 of Q4 to ground. Examples of how Cpk, as well as other element(s) of the bias circuit 112 can be configured to operate as part of and/or in conjunction with the bias adjustment circuit 104 are described herein in greater detail.

FIG. 9 shows that in some embodiments, the detection circuit 160 described in reference to FIG. 7 can include N diode(s) arranged in series between the collector node 130 of the cascode transistor Q2 and the base node 124 of Q4. The quantity N can be a positive integer, and such a number can depend on, for example, turn-on voltage characteristics. For example, 12 diodes with each being a 1.2V diode can yield a detection circuit having a threshold voltage difference of 12×1.2V=14.4V between the collector node 130 (of Q2) and the base node 124 (of Q4). For the cascode transistor Q2, such 12 diodes providing the coupling between Q4 and Q2 can yield a threshold value of approximately 17V (e.g., 1.2V×(12 diodes)+2Vbe) between its collector node 130 and its base node 126. Such an approximate value of 17V can result when the diode voltage Vd and Vbe are very similar, such that 1.2V×(12 diodes)+2Vbe can be expressed as being approximately equal to (1.2)(12)V+2(1.2)≈17V.

In some embodiments, the capacitance Cpk can be configured to allow build-up of charge when the chain of N diodes become conductive, to thereby increase the voltage at the base of Q4. Accordingly, the current passed through Q4 also increases, thereby increasing the voltage Vbb2 at the base node 126 of Q2.

In some embodiments, the capacitance Cpk and the resistance Ratk can be configured to work in conjunction to, for example, set the video bandwidth of the peak detector function. In some embodiments, the resistance Rfilt and the cascode base bypass capacitance Ccsd can be configured to, for example, define the dominant pole of the feedback loop for stable loop operation.

As described herein, the detection circuit 160 of FIGS. 7 and 9 can be implemented as an RF peak detector that allows modification of a bias point of a cascode gain stage during an extreme operating condition. A PA (e.g., 100 in FIGS. 7 and 9) having such a peak detector can be configured to utilize a fixed bias cascode to maximize RF swing on the cascode gain stage (Q2) and minimize overhead of the common emitter gain stage (Q1).

For example, it is noted that there is a significant range of operating voltage available in the common emitter gain stage (Q1) before it is subjected to a breakdown condition. Such a range of Q1 can allow the bias point of the cascode gain stage (Q2) to be adjusted as described herein to prevent breakdown of Q2. Accordingly, nominal operation of Q2 can be configured so that nominal voltage peaks are near device breakdown. If some of such voltage peaks exceeds the threshold set by the RF peak detector, the bias point of Q2 can be adjusted as described herein.

In various examples described herein, the cascode amplifiers are described in the context of BJTs. However, it will be understood that one or more features of the present disclosure can be implemented in cascode amplifiers that include other types of transistors, such as field-effect transistors (FETs).

It will also be understood that while various examples are described in the context of NPN devices which results in corresponding voltage levels, one or more features of the present disclosure can also be implemented in PNP devices, or in applications where voltage levels may be different than in NPN devices.

Figure 10:
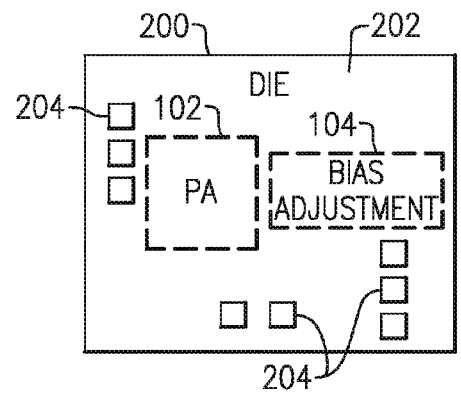
FIG. 10 depicts a semiconductor die that can include a bias adjustment circuit having one or more features as described herein.

FIG. 10 depicts a semiconductor die 200 that can include a bias adjustment circuit 104 having one or more features as described herein. The semiconductor die 200 can include a substrate 202. In some embodiments, a power amplifier (PA)

circuit 102 (e.g., SiGe or GaAs devices) can also be implemented on the substrate 202. A plurality of connection pads 204 can also be formed on the substrate 202 to provide, for example, power and signals for the PA circuit 102.

Figure 11:
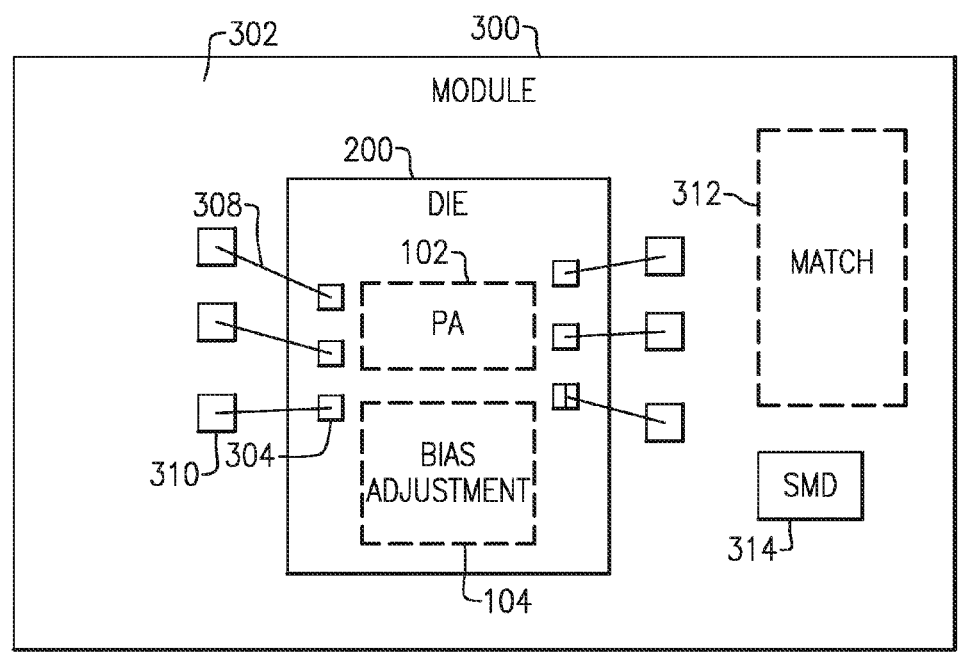
FIG. 11 depicts a module that can include one or more features as described herein.

In some implementations, one or more features described herein can be included in a module. FIG. 11 depicts an example module 300 having a packaging substrate 302 that is configured to receive a plurality of components. In some embodiments, such components can include a die 200 having one or more features as described herein. For example, the die 200 can include a PA circuit 102 and a bias adjustment circuit 104. A plurality of connection pads 304 can facilitate electrical connections such as wirebonds 308 to connection pads 310 on the substrate 302 to facilitate passing of various power and signals to and from the die 200.

In some embodiments, other components can be mounted on or formed on the packaging substrate 302. For example, one or more surface mount devices (SMDs) (314) and one or more matching networks (312) can be implemented. In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 12:
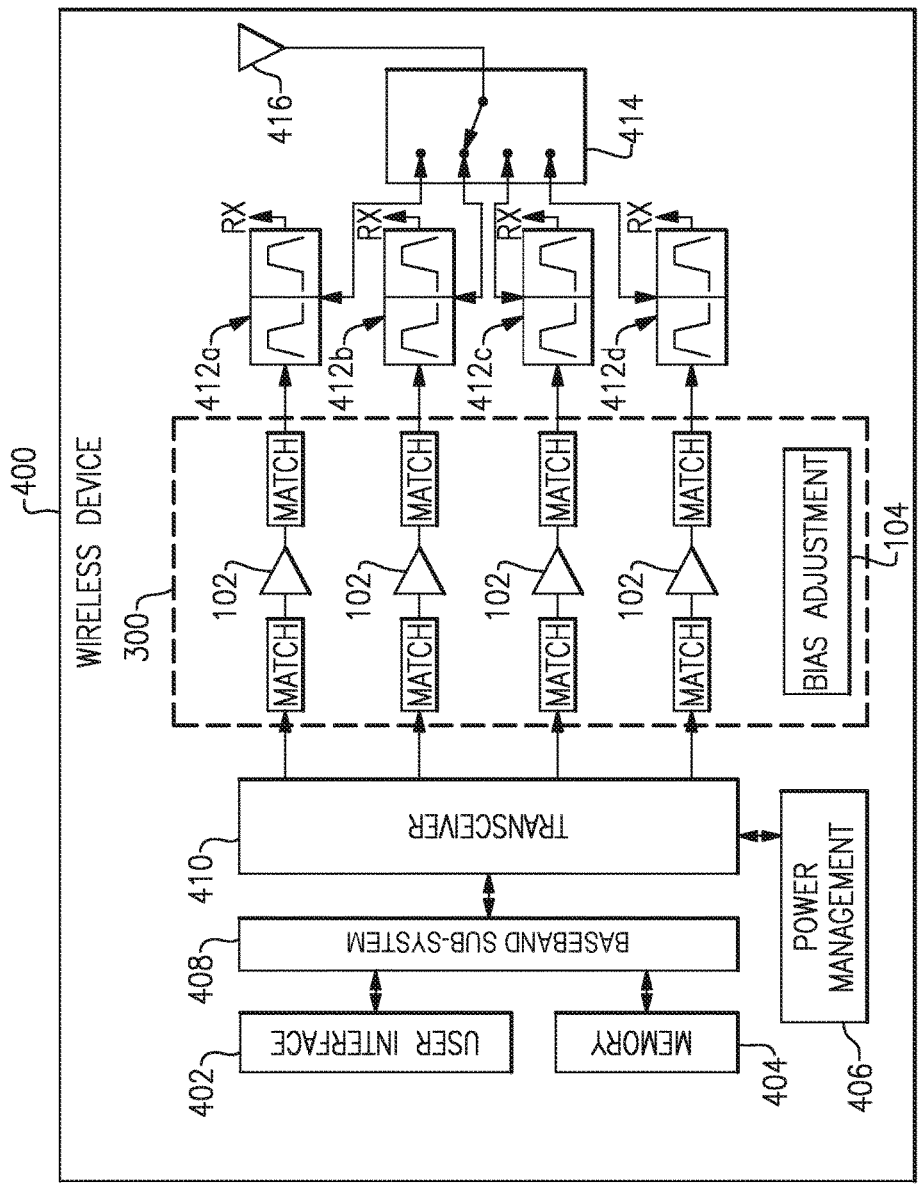
FIG. 12 depicts an example wireless device having one or more advantageous features described herein.

FIG. 12 schematically depicts an example wireless device 400 having one or more advantageous features described herein. One or more PAs 102 as described herein can utilize one or more bias adjustment circuits 104 as described herein. In embodiments where the PAs 102 and their bias adjustment circuit(s) 104 are packaged into a module, such a module can be represented by a dashed box 300. In some embodiments, the module 300 can include at least some of input and output matching circuits.

The PAs 102 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 102 are shown to be matched and routed to an antenna 416 via their respective duplexers 412a-412d and a band-selection switch 414. The band-selection switch 414 can be configured to allow selection of, for example, an operating band or an operating mode. In some embodiments, each duplexer 412 can allow transmit and receive operations to be performed simultaneously using a common antenna (e.g., 416). In FIG. 12, received signals are shown to be routed to "Rx" paths that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
a cascode amplifier circuit including a cascode gain stage transistor having an output and a bias node;
a bias circuit configured to provide a bias voltage at the bias node of the cascode gain stage transistor; and
a bias adjustment circuit implemented between the output of the cascode gain stage transistor and the bias circuit, and configured to cause the bias circuit to adjust the bias voltage in response to a voltage at the output exceeding a threshold value.

2. The power amplifier of claim 1 wherein the cascode gain stage transistor is implemented as a bipolar-junction transistor having a base as the bias node, and a collector as the output.

3. The power amplifier of claim 2 wherein the bias circuit includes an emitter follower having an emitter coupled to the base of the cascode gain stage transistor, a collector coupled to a DC voltage source, and a base coupled to a reference voltage source.

4. The power amplifier of claim 3 wherein the bias adjustment circuit includes a detection circuit that couples the collector of the cascode gain stage transistor and the base of the emitter follower, the detection circuit configured to be conducting when the voltage at the collector of the cascode gain stage transistor is greater than the threshold value and non-conducting when the voltage at the collector of the cascode gain stage transistor is less than or equal to the threshold value.

5. The power amplifier of claim 4 wherein the detection circuit includes one or more diodes arranged in series, the number of diodes selected based at least in part on the threshold value and turn-on characteristic of each diode.

6. The power amplifier of claim 5 wherein the one or more diodes include a plurality of substantially same diodes.

7. The power amplifier of claim 6 wherein the plurality of diodes are selected to provide the threshold value by Vdiode (Ndiodes+2Vbe), Vdiode being a turn-on voltage of each diode, Ndiodes being the number of diodes, and 2Vbe being a potential difference between the emitter of the emitter follower and the base of the cascode gain stage transistor.

8. The power amplifier of claim 4 wherein the bias adjustment circuit further includes a capacitance Cpk that couples the base of the emitter follower to ground, the capacitance Cpk configured to allow charge to be accumulated from the detection circuit when the detection circuit is conducting, to thereby adjust the voltage at the base of the emitter follower.

9. The power amplifier of claim 2 wherein the bias adjustment circuit is configured to cause the bias circuit to increase the bias voltage in response to the voltage at the output exceeding the threshold value to thereby reduce a potential difference between the output and bias node of the cascode gain stage transistor to a value less than the threshold value.

10. The power amplifier of claim 9 wherein the threshold value is at or close to a breakdown voltage between the output and bias node of the cascode gain stage transistor, such that the reduction of the potential difference prevents or reduces the likelihood of breakdown of the cascode gain stage transistor.

11. The power amplifier of claim 10 wherein the bias adjustment circuit is further configured to cause the bias circuit to restore the bias voltage to a normal operating value when the voltage at the output of the cascode gain stage transistor is less than or equal to the threshold value.

12. The power amplifier of claim 2 wherein the cascode amplifier circuit further includes a common emitter gain stage transistor having a base configured to receive a signal and a collector coupled to the emitter of the cascode gain stage transistor.

13. The power amplifier of claim 12 wherein the common emitter gain stage transistor is configured to have a significant range of operating voltage to allow the bias voltage of the cascode gain stage transistor to be adjusted in a relatively large range to prevent or reduce the likelihood of breakdown of the cascode gain stage transistor.

14. The power amplifier of claim 13 wherein the relatively large range of the bias voltage available for the cascode gain stage transistor allows the cascode gain stage transistor to be operated in a nominal condition with nominal voltage peaks that are near a device breakdown voltage.

15. A power amplifier module comprising:
a packaging substrate configured to receive a plurality of components; and
a power amplifier circuit implemented on the packaging substrate and including a cascode amplifier circuit having a cascode gain stage transistor with an output and a bias node, the power amplifier circuit further including a bias circuit configured to provide a bias voltage at the bias node of the cascode gain stage transistor, the power amplifier circuit further including a bias adjustment circuit implemented between the output of the cascode gain stage transistor and the bias circuit, and configured to cause the bias circuit to adjust the bias voltage in response to a voltage at the output exceeding a threshold value.

16. The power amplifier module of claim 15 wherein the power amplifier circuit is implemented on a semiconductor die.

17. The power amplifier module of claim 16 wherein the semiconductor die includes gallium arsenide.

18. The power amplifier module of claim 16 wherein the semiconductor die includes silicon germanium.

19. A wireless device comprising:
a transmitter configured to generate a signal;
a power amplifier circuit configured to amplify the signal, and including a cascode amplifier circuit having a cascode gain stage transistor with an output and a bias node, the power amplifier circuit further including a bias circuit configured to provide a bias voltage at the bias node of the cascode gain stage transistor, the power amplifier circuit further including a bias adjustment circuit implemented between the output of the cascode gain stage transistor and the bias circuit, and configured to cause the bias circuit to adjust the bias voltage in response to a voltage at the output exceeding a threshold value; and
an antenna coupled to the output of the cascode gain stage transistor and configured to facilitate transmission of the amplified signal.

20. The wireless device of claim 19 wherein the wireless device includes a cellular phone.

* * * * *